US010283520B2

(12) United States Patent
Hopkins et al.

(10) Patent No.: US 10,283,520 B2
(45) Date of Patent: May 7, 2019

(54) ELEVATIONALLY-EXTENDING STRING OF MEMORY CELLS INDIVIDUALLY COMPRISING A PROGRAMMABLE CHARGE STORAGE TRANSISTOR AND METHOD OF FORMING AN ELEVATIONALLY-EXTENDING STRING OF MEMORY CELLS INDIVIDUALLY COMPRISING A PROGRAMMABLE CHARGE STORAGE TRANSISTOR

(71) Applicant: Micron Technology, Inc., Boise, ID (US)

(72) Inventors: John D. Hopkins, Meridian, ID (US); David Daycock, Boise, ID (US); Yushi Hu, Boise, ID (US); Christopher Larsen, Boise, ID (US); Dimitrios Pavlopoulos, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 15/208,206

(22) Filed: Jul. 12, 2016

(65) Prior Publication Data
US 2018/0019255 A1    Jan. 18, 2018

(51) Int. Cl.
*H01L 29/788* (2006.01)
*H01L 21/225* (2006.01)
(Continued)

(52) U.S. Cl.
CPC ...... *H01L 27/11582* (2013.01); *H01L 21/225* (2013.01); *H01L 23/528* (2013.01);
(Continued)

(58) Field of Classification Search
None
See application file for complete search history.

(56) References Cited

U.S. PATENT DOCUMENTS 9,190,490 B2    11/2015    Koval et al.
9,196,625 B2    11/2015    Koval
(Continued)

FOREIGN PATENT DOCUMENTS

WO    WO 2016/048615    3/2016

OTHER PUBLICATIONS

WO PCT/US2017/044568, Nov. 14, 2017, Written Opinion.
(Continued)

*Primary Examiner* — Matthew L. Reames
*Assistant Examiner* — John A Bodnar
(74) *Attorney, Agent, or Firm* — Well St. John P.S.

(57) ABSTRACT

An elevationally-extending string of memory cells comprises an upper stack elevationally over a lower stack. The upper and lower stacks individually comprise vertically-alternating tiers comprising control gate material of individual charge storage field effect transistors vertically alternating with insulating material. An upper stack channel pillar extends through multiple of the vertically-alternating tiers in the upper stack and a lower stack channel pillar extends through multiple of the vertically-alternating tiers in the lower stack. Tunnel insulator, charge storage material, and control gate blocking insulator is laterally between the respective upper and lower stack channel pillars and the control gate material. A conductive interconnect comprising conductively-doped semiconductor material is elevationally between and electrically couples the upper and lower stack channel pillars together. The conductively-doped semiconductor material comprises a first conductivity-producing dopant. The conductive interconnect comprises a lower half thereof having a conductive region comprising at least one of (a) conductive material below the conductively-doped semiconductor material, or (b) a second non-p-type dopant within the conductively-doped semiconductor material that
(Continued)

is different from the first dopant, the second dopant being present at an atomic concentration within the semiconductor material of at least 0.1%. Other embodiments, including method, are disclosed.

31 Claims, 4 Drawing Sheets

(51) Int. Cl.
    *H01L 23/532* (2006.01)
    *H01L 23/528* (2006.01)
    *H01L 27/11582* (2017.01)
    *H01L 27/11556* (2017.01)
    *H01L 27/11519* (2017.01)
    *H01L 27/11565* (2017.01)
    *H01L 27/11568* (2017.01)
    *H01L 27/11524* (2017.01)

(52) U.S. Cl.
    CPC .. *H01L 23/53266* (2013.01); *H01L 27/11519* (2013.01); *H01L 27/11524* (2013.01); *H01L 27/11556* (2013.01); *H01L 27/11565* (2013.01); *H01L 27/11568* (2013.01); *H01L 29/7883* (2013.01)

(56) References Cited

U.S. PATENT DOCUMENTS

| | | |
|---|---|---|
| 9,330,763 B1 | 5/2016 | Zhang et al. |
| 9,437,604 B2 | 9/2016 | Lu et al. |
| 9,484,353 B1 | 11/2016 | Lai et al. |
| 9,595,531 B2 | 3/2017 | Zhu et al. |
| 9,748,265 B1 | 8/2017 | Lee |
| 2010/0181612 A1 | 7/2010 | Kito et al. |
| 2012/0003800 A1 | 1/2012 | Lee et al. |
| 2012/0003828 A1 | 1/2012 | Chang et al. |
| 2012/0306090 A1 | 12/2012 | Smith et al. |
| 2013/0215684 A1 | 8/2013 | Oh et al. |
| 2014/0061747 A1 | 3/2014 | Tanzawa et al. |
| 2014/0264525 A1 | 9/2014 | Takahashi et al. |
| 2014/0273373 A1 | 9/2014 | Makala et al. |
| 2015/0118811 A1 | 4/2015 | Makala et al. |
| 2015/0221347 A1 | 8/2015 | Koval et al. |
| 2015/0270280 A1 | 9/2015 | Simsek-Ege et al. |
| 2015/0279855 A1 | 10/2015 | Lu et al. |
| 2015/0325587 A1 | 11/2015 | Chen |
| 2015/0333143 A1 | 11/2015 | Meldrim |
| 2016/0099323 A1 | 4/2016 | Hopkins |
| 2016/0133640 A1 | 5/2016 | Zhu et al. |
| 2016/0204117 A1 | 7/2016 | Liu et al. |

OTHER PUBLICATIONS

WO PCT/US2017/044568, Nov. 14, 2017, Search Report.
Zhu et al., U.S. Appl. No. 15/229,490, filed Aug. 5, 2016, titled "Vertical String of Memory Cells Individually Comprising a . . . ", 43 pages.

US 10,283,520 B2

ELEVATIONALLY-EXTENDING STRING OF MEMORY CELLS INDIVIDUALLY COMPRISING A PROGRAMMABLE CHARGE STORAGE TRANSISTOR AND METHOD OF FORMING AN ELEVATIONALLY-EXTENDING STRING OF MEMORY CELLS INDIVIDUALLY COMPRISING A PROGRAMMABLE CHARGE STORAGE TRANSISTOR

TECHNICAL FIELD

Embodiments disclosed herein pertain to elevationally-extending strings of memory cells individually comprising a programmable charge storage transistor and to methods of forming such.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Memory cell strings may be arranged to extend horizontally or vertically. Vertical memory cell strings reduce horizontal area of a substrate occupied by the memory cells in comparison to horizontally extending memory cell strings, albeit typically at the expense of increased vertical thickness. Vertical memory cell strings are usually fabricated in multiple stacks or decks which facilitates the manufacturing thereof. Each stack includes vertically-alternating tiers comprising control gate material of individual charge storage transistors that vertically alternate with insulating material. A channel pillar extends through each of the stacks and a conductive interconnect electrically couples the channels of immediately elevationally adjacent channel pillars together. Conductively-doped polysilicon is one example material for the conductive interconnect. Such may, for example, be conductively doped with phosphorus (an n-type material). The phosphorus can diffuse elevationally above and below the polysilicon into the upper and lower stack channel materials. More may diffuse down than up which can adversely impact programmable memory cells in the elevationally outermost portion of the lower stack.

DETAILED DESCRIPTION OF EXAMPLE EMBODIMENTS

Figure 1:
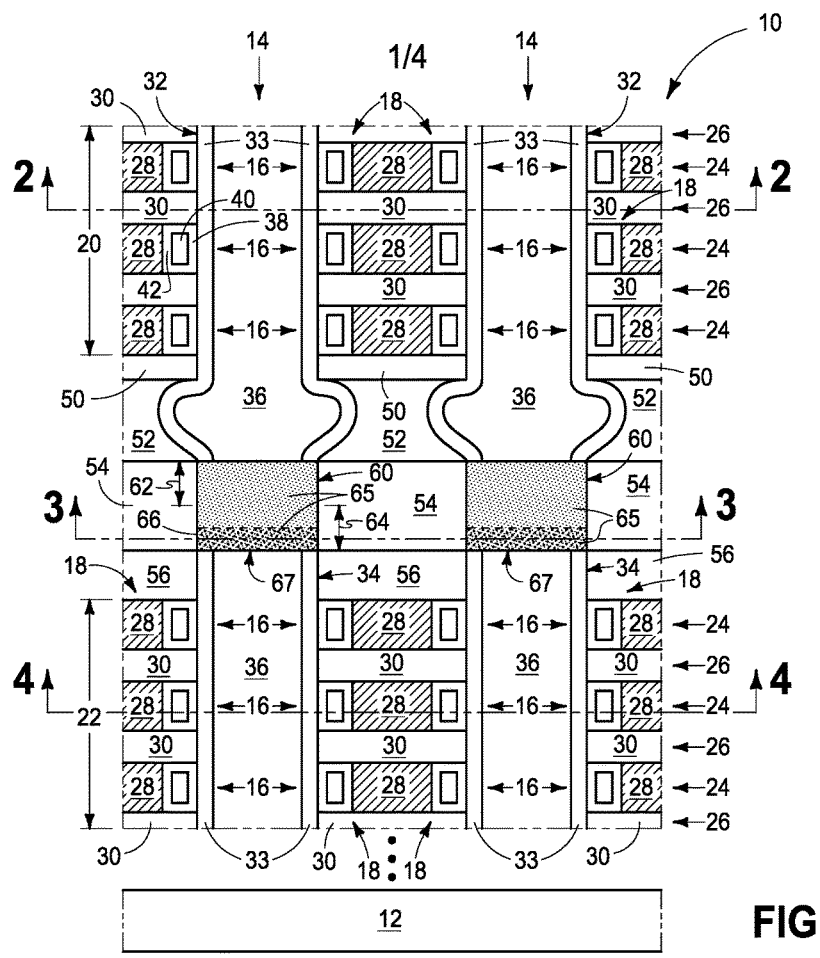
FIG. 1 is a diagrammatic sectional view of a portion of an elevationally-extending string of memory cells in accordance with an embodiment of the invention.
Figure 2:
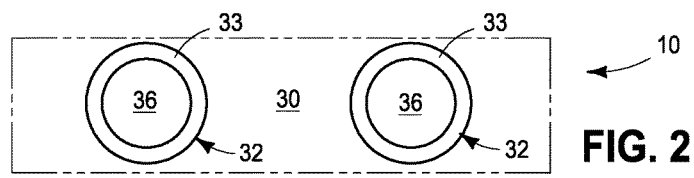
FIG. 2 is a sectional view taken through line 2-2 in FIG. 1.
Figure 3:
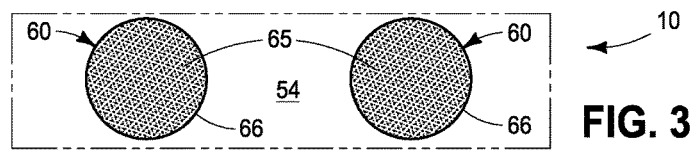
FIG. 3 is a sectional view taken through line 3-3 in FIG. 1.
Figure 4:
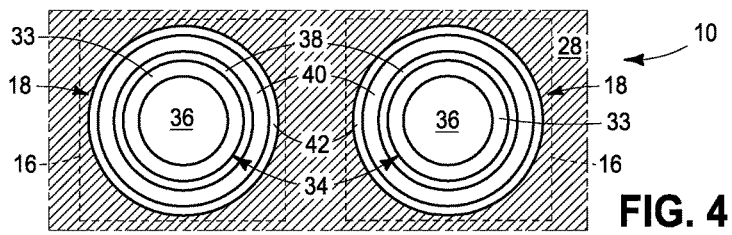
FIG. 4 is a sectional view taken through line 4-4 in FIG. 1.

Embodiments of the invention encompass an elevationally-extending string of memory cells individually comprising a programmable storage transistor. Embodiments of the invention also encompass a method of forming such a string. In this document, "elevationally-extending" and "extending elevationally" refer to a direction that is angled away by at least 45° from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further in this document unless otherwise stated, "elevational(ly)", "higher", "upper", "lower", "top", "atop", "bottom", "above", "below", "under", "beneath", "up", and "down" are generally with reference to the vertical direction. Also, "elevationally-extending" and "extending elevationally" with respect to a field effect transistor is with reference to orientation of the transistor's channel length along which current flows in operation between the source/drain regions.

A first embodiment elevationally-extending string of memory cells is shown and described with reference to FIGS. 1-4. Such includes a construction 10 comprising a base substrate 12 that may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the FIGS. 1-4-depicted materials. For example, other partially or wholly fabricated components of integrated circuitry may be provided somewhere above, about, or within substrate 12. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Construction 10 is shown as comprising two elevationally-extending strings 14 of memory cells 16 individually comprising a programmable charge storage field effect transistor 18. Construction 10 comprises an upper stack or deck 20 that is elevationally over a lower stack or deck 22. Upper and lower stacks 20, 22 individually comprise vertically-alternating tiers 24, 26 comprising control gate material 28 (in tiers 24) of individual charge storage transistors 18 alternating with insulating material 30 (in tiers 26). Example conductive compositions for control gate material 28 are one or more of elemental metal, a mixture or alloy of two or more elementals, conductive metal compounds, and conductively-doped semiconductive materials. Example insulating compositions for material 30 are one or more of silicon dioxide and silicon nitride. Example thicknesses for materials 28 and 30 are 350 Angstroms and 200 Angstroms, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Only a few alternating tiers 24, 26 are shown with respect to each deck 20, 22, although each deck would likely have dozens or more of each of tiers 24 and 26. Additionally, only two stacks 20 and 22 are shown, although one or more additional stacks (not shown) may also be provided. Further and regardless, each stack need not be fabricated identically relative another stack nor include identical materials. Regardless, any construction in accordance with the invention will have some upper stack 20 and an adjacent lower stack 22. Transistors 18 in one or more tiers in the lowest part of upper stack 20 and uppermost part of lower stack 22 may be "dummy" which may or may not store data. Further, an array of memory cells will likely include many more than two elevationally-extending strings 14. The description largely proceeds with respect to construction and method associated with a single string 14, although others if not all strings within an array will likely have the same attributes. In some embodiments, elevationally-extending string 14 is vertical or within 10° of vertical.

An upper stack channel pillar 32 extends through multiple of vertically-alternating tiers 24, 26 in upper stack 20. A lower stack channel pillar 34 extends through multiple of vertically-alternating tiers 24, 26 in lower stack 22. Channel pillars 32 and 34 are shown as comprising channel material 33 and as being hollow channel pillars internally filled with dielectric material 36 (e.g., silicon dioxide and/or silicon nitride). Alternately, one or both of the upper and lower stack channel pillars may be non-hollow, for example comprising channel material extending completely diametrically-across the pillar (e.g., no internal dielectric material 36 and not shown). Regardless, the channel pillar material 33 ideally comprises doped semiconductive material (e.g., poly silicon) having the channel conductivity-modifying dopant(s) present in a quantity that produces intrinsic semiconductor properties enabling the upper and lower channel pillars to operably function as switchable "on" and "off" channels for the individual memory cells for control gate voltage above and below, respectively, a suitable threshold voltage ($V_t$) depending on programming state of the charge storage transistor for the respective individual memory cell. An example such dopant quantity is from $5 \times 10^{17}$ atoms/cm$^3$ to $5 \times 10^{18}$ atoms/cm$^3$. Channel material 33 may be p-type or n-type.

Tunnel insulator 38 (e.g., one or more of silicon dioxide and silicon nitride), charge storage material 40 (e.g., material suitable for utilization in floating gates or charge-trapping structures, such as, for example, one or more of silicon, silicon nitride, nanodots, etc.), and control gate blocking insulator 42 (e.g., one or more of silicon nitride, silicon dioxide, hafnium oxide, zirconium oxide, etc.) are laterally between upper/lower stack channel pillars 32, 34, respectively, and control gate material 28 in tiers 24. Base substrate 12 may comprise conductively-doped semiconductor material comprising source lines (not shown) connecting with a lowest stack channel pillar and which may comprise a portion of circuitry for the vertical string of memory cells. Additionally, a conductive line (not shown) may connect with an uppermost stack channel pillar and which may comprise a portion of circuitry for the vertical string of memory cells.

Individual memory cells 16 may comprise other alternate or yet-to-be-developed constructions that include an elevationally-extending upper stack channel pillar and an elevationally-extending lower stack channel pillar, and may be fabricated by any method. For example and by way of example only, construction 10 has memory cell materials 38, 40, and 42 elevationally between underlying and overlying insulator material 30. Such may be manufactured by a so-called "gate first" process whereby an opening in which the channel pillar is formed is first-formed through alternating tiers of conductive material 28 and insulator material 30. Conductive material 28 is then laterally recessed back from sidewalls of that opening by isotropic etching, followed by deposition of materials 42, 40, and 38 into the annular recesses so formed. Such materials are then etched to remove them from being outside of the annular recesses, followed by deposition of the channel material. Alternately, only materials 42 and 40 may be deposited into the recesses, followed by deposition of tunnel insulator 38 and then deposition of the channel material (e.g., after etching materials 42 and 40 from being within the opening outside of the annular recesses).

Alternately by way of example only, the memory cells may be fabricated such that materials 38, 40, and 42 are not elevationally between (not shown) insulator material 30 that is in different tiers 26, for example by a so-called "gate last" or "replacement gate" process. There, a stack is manufactured to comprise tiers of vertically-alternating different composition insulating materials, and an opening for the channel material is then formed there-through. Then, materials 42, 40, and 38 are deposited as circumferential linings in such opening, followed by deposition of the channel material into the opening. Then, slits are etched through the stack to produce a desired control gate pattern, and one of the insulator materials is isotropically etched away to leave void space elevationally between the other insulating material (e.g., 30) that is in different tiers. The conductive control gate material is there-after conformally deposited to fill the slits and void spaces, followed by anisotropic etching of the conductive material from the slits, thus leaving patterned control gates. Also, construction 10 is shown as comprising a single memory cell 16 about the channel pillar in each tier 24 in a string 14. Alternately, and by way of example only, any existing or yet-to-be-developed construction may be used wherein two or more memory cells are circumferentially spaced about the channel in a single tier in a given string (not shown).

A plurality of materials is shown elevationally between upper stack 20 and lower stack 22. Such might be fabricated separately from the fabrication of upper stack 20 and lower stack 22, or may be fabricated in whole or in part when fabricating upper stack 20 and/or lower stack 22. Accordingly, such one or more of such intervening materials might be considered as part of one or both of upper stack 20 and lower stack 22. Such intervening materials are shown as including different dielectric materials 50 (e.g., 100 Angstroms of $SiO_2$), 52 (e.g., 540 Angstroms of $Al_2O_3$), 54 (e.g., 600 Angstroms of $Si_3N_4$), and 56 (e.g., 200 Angstroms of $SiO_2$). Upper stack channel pillar 32 is shown as having a lower portion thereof that bulges radially outward within or into dielectric material 52, which may occur as an artifact of manufacture wherein insulator material 52 is wet isotropically etched to expose material there-below before forming channel pillar 32.

A conductive interconnect 60 comprising conductively-doped semiconductor material 65 is between and electrically couples (in one embodiment directly electrically couples) upper stack channel pillar 32 and lower stack channel pillar 34 together. In this document, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components. Any suitable conductively-doped semiconductor material may be used for material 65, for example, conductively-doped silicon, germanium, or a combination of silicon and germanium. Regardless, such material will include a first conductivity-producing dopant therein (i.e., one dopant or multiple different dopants at a suitable overall peak concentration that is what renders and results in material 65 being conductive, for example an overall concentration of at least $1\times10^{19}$ atoms/cm$^3$ [about 0.02% atomic], ideally from $1\times10^{20}$ atoms/cm$^3$ to $1\times10^{21}$ atoms/cm$^3$ [about 0.2% to 2% atomic, respectively]). In one embodiment, the conductivity-producing dopant is n-type, for example in one embodiment being phosphorus. Alternately in some embodiments, and perhaps at least in part depending upon whether the programmable transistors in the string are PMOS or NMOS, the conductivity-producing dopant within conductive interconnect 60 may be p-type (e.g., B). An example elevational thickness for conductive interconnect 60 is 100 Angstroms to 3,000 Angstroms, with 500 Angstroms being a more ideal example.

Conductive interconnect 60 may be considered as comprising a lower half 64 and an upper half 62. In one embodiment, lower half 64 has a conductive region 66 comprising non-p-type dopant within conductively-doped semiconductor material 65 that is different from the first dopant, with the second dopant being present in region 66 at an atomic concentration within the semiconductor material of at least 0.1%. In one embodiment, the second non-p-type dopant is not electrically active (i.e., is not an n-type conductivity-modifying dopant). In the context of this document a "not electrically active" dopant is conductivity-neutral to semiconductor properties in semiconductor material and provided at a concentration that is insufficient to appreciably form a stoichiometric compound with the semiconductor material (e.g., silicon) if such dopant is even capable of forming a stoichiometric compound with the semiconductor material. Examples include at least one of carbon atoms and nitrogen atoms. An example atomic concentration of all of C and/or N dopant present within the conductively-doped semiconductor material in regions 66 is from 0.1% to 40%, with from 0.5% to 2% being ideal. In one embodiment, the second non-p-type dopant is electrically active and n-type, with one example being As. An example atomic concentration for arsenic is from 0.5% to 20%, with 0.5% to 8% being ideal. An example elevational thickness for region 66 is 30 Angstroms to 300 Angstroms.

In one embodiment, region 66 may operate as an asymmetric diffusion barrier that allows greater diffusion of the conductivity-producing dopant from conductively-doped semiconductor material 65 into upper stack channel pillar 32 than diffusion, if any, of said dopant from conductively-doped semiconductor material 65 into lower stack channel pillar 34. At least during manufacture of construction 10, the conductivity-producing dopant within semiconductor material 65 is inherently subjected to elevated temperature that may cause diffusion (i.e., thermal diffusion) of some of such dopant out of conductively-doped semiconductor material 65. It may be desirable that little, if any, of such dopant diffuse into lower stack channel pillar 34, and it may be desirable that such dopant diffuse into upper stack channel pillar 32.

Conductive interconnect 60 including conductive region 66 may be formed by any suitable existing or yet-to-be-developed method. For example, conductive region 66 may be formed by ion implantation and/or during deposition of conductively-doped semiconductor material 65. Further, material 65 may be doped during its deposition, ion implanted after its deposition, or both. Regardless and by way of example only, conductively-doped semiconductor material 65 might be formed radially inside of channel material 33 of lower stack channel pillar 34 if hollow. If doped by ion implantation, such will inherently transform the hollow channel material radially outward of material 65 into conductively-doped semiconductor material 65. If in situ doped during deposition, radial out-diffusion of such dopant into the hollow channel material will occur inherent in heating of the substrate during manufacture and which will also transform that hollow channel material radially outward of material 65 into conductively-doped semiconductor material 65. Analogously, some channel material of upper stack channel pillar 34 that is immediately proximate and directly against conductively-doped semiconductive material 65 may also be so transformed.

Figure 5:
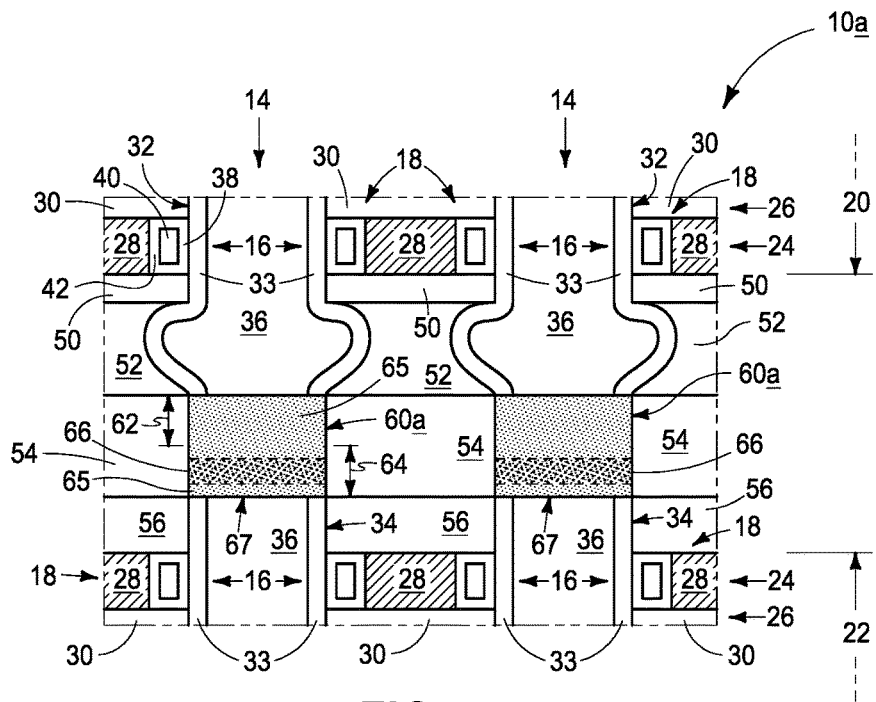
FIG. 5 is a diagrammatic sectional view of a portion of an elevationally-extending string of memory cells in accordance with an embodiment of the invention.

FIGS. 1-4 show an example embodiment wherein conductive interconnect 60 has an elevationally innermost surface 67 and region 66 extends elevationally inward to innermost surface 67. An alternate embodiment construction 10a is described with reference to FIG. 5. Like numerals from the above-described embodiments have been used where appropriate, with some construction differences being indicated with the suffix "a". FIG. 5 depicts an example embodiment wherein region 66 of conductive interconnect 60a does not extend elevationally inward to innermost surface 67, rather being elevationally displaced upwardly therefrom. Any other attribute(s) or aspect(s) as shown and/or described above may be used.

Figure 6:
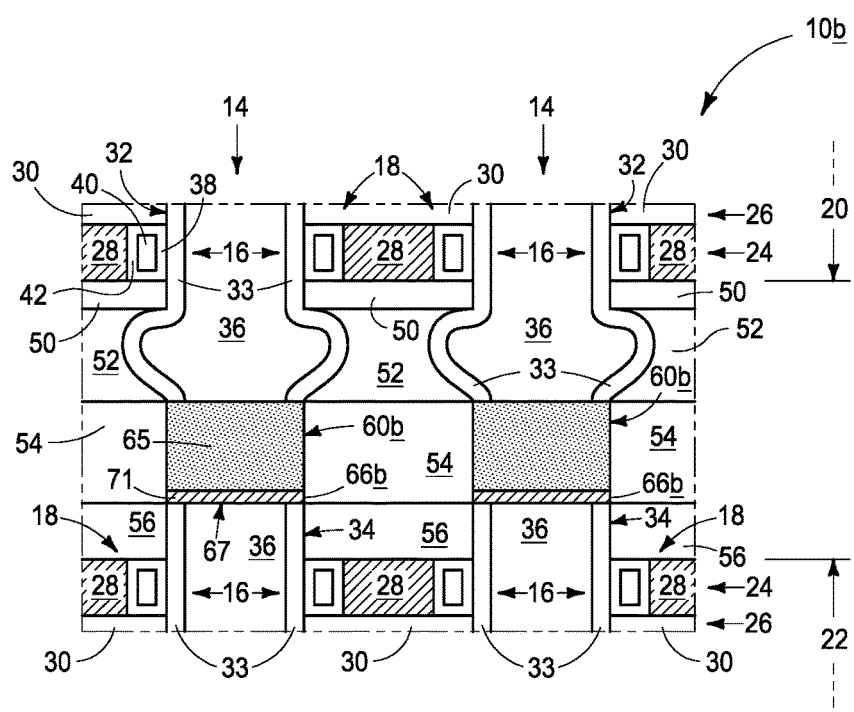
FIG. 6 is a diagrammatic sectional view of a portion of an elevationally-extending string of memory cells in accordance with an embodiment of the invention.

An alternate embodiment construction 10b is next described with reference to FIG. 6. Like numerals from the above-described embodiments have been used where appropriate, with some construction differences being indicated with the suffix "b" or with different numerals. Region 66b of conductive interconnect 60b comprises conductive material 71 below conductively-doped semiconductor material 65, and which in one embodiment as shown is directly against conductively-doped semiconductor material 65. In one embodiment, conductive material 71 is not another conductively-doped semiconductor material, and in one embodiment is metal material. In the context of this document, "metal material" is any one or combination of an elemental metal, a mixture or an alloy of two or more elemental metals, and any conductive metal compound. In one embodiment, conductive material 71 comprises at least one of Ti, TiN, W, WN, $WSi_x$, TiSi, $Ti_xSi_yN_z$, and $W_xSi_yN_z$. In one embodiment, conductive material 71 comprises a non-stoichiometric metal-rich amorphous compound, with examples being one or more of titanium-rich titanium nitride, titanium-rich titanium silicide, tungsten-rich tungsten nitride, and tungsten-rich tungsten silicide. An example thickness for region 66b is 10 Angstroms to 100 Angstroms. Any other attribute(s) or aspect(s) as shown and/or described above may be used. For example and by way of example only, conductive material 71 may be elevationally displaced upwardly (not shown) from surface 67.

Figure 7:
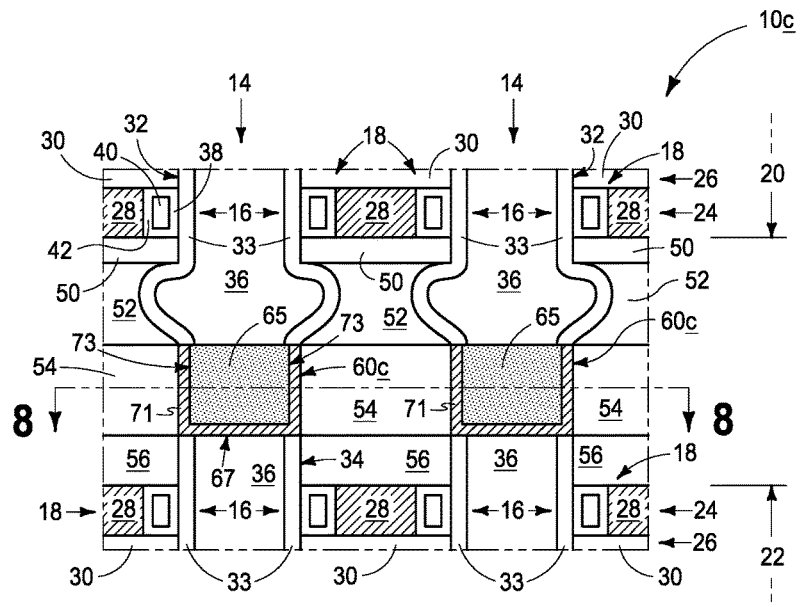
FIG. 7 is a diagrammatic sectional view of a portion of an elevationally-extending string of memory cells in accordance with an embodiment of the invention.
Figure 8:
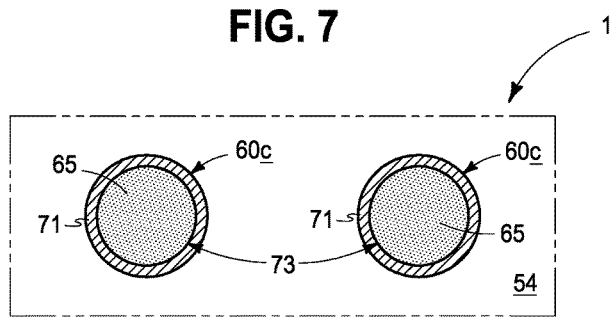
FIG. 8 is a sectional view taken through line 8-8 in FIG. 7.

Another example construction 10c is shown and described with reference to FIGS. 7 and 8. Like numerals from the above-described embodiments have been used where appropriate, with some construction differences being indicated with the suffix "c" or with different numerals. Conductive material 71 of conductive interconnect 60c is shown extending elevationally upward along sidewalls 73 of conductively-doped semiconductor material 65. The example embodiment of FIG. 6 does not have conductive material 71 extending elevationally upward along sidewalls of conductively-doped semiconductor material 65. Any other attribute(s) or aspect(s) as shown and/or described above may be used. Additionally by way of example, conductive regions 66 in the embodiments of FIGS. 1-5 may also extend upwardly along sidewalls (not shown) of conductively-doped semiconductor material 65.

Figure 9:
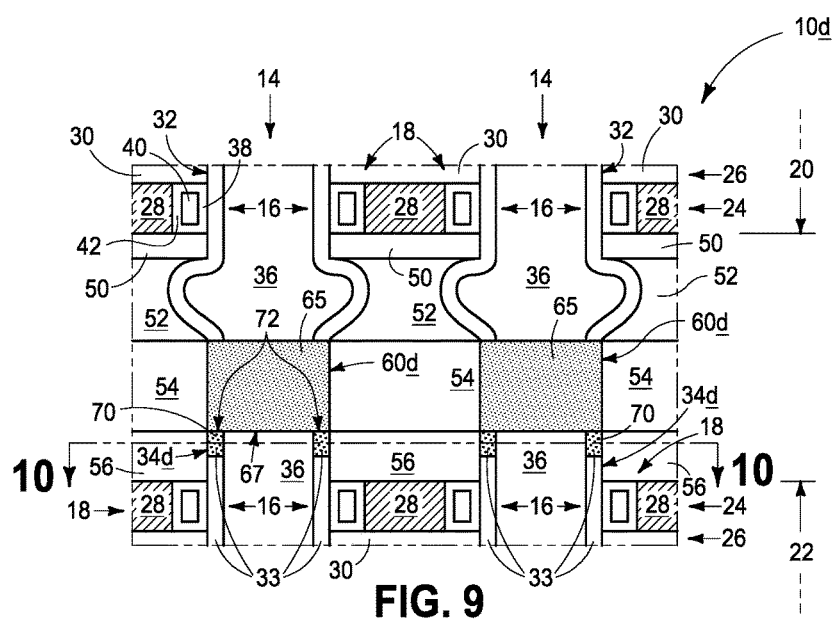
FIG. 9 is a diagrammatic sectional view of a portion of an elevationally-extending string of memory cells in accordance with an embodiment of the invention.
Figure 10:
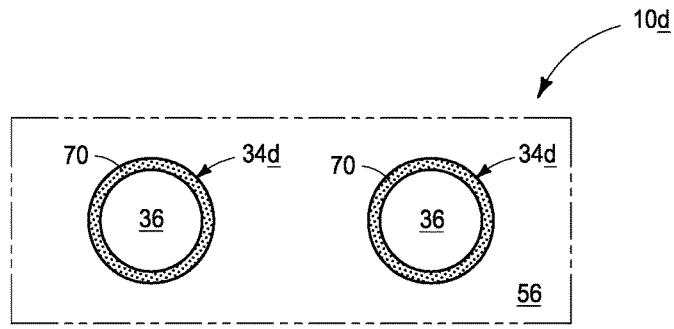
FIG. 10 is a sectional view taken through line 10-10 in FIG. 9.

Additional embodiments in accordance with the invention are next described with respect to FIGS. 9 and 10 with respect to a construction 10d. Like numerals from the above-described embodiments have been used where appropriate, with some construction differences being indicated with the suffix "d" or with different numerals. Lower stack channel pillar 34d comprises an upper region 70 comprising a second non-p-type dopant that is different from the first dopant and is different from the channel conductivity-modifying dopant, with the second dopant being present in such upper region at an atomic concentration of at least 0.1%. Example materials and concentrations of such dopants are as described above (e.g., C, N, and As being but three examples). Any other attribute(s) or aspect(s) as shown and/or described above may be used.

Figure 11:
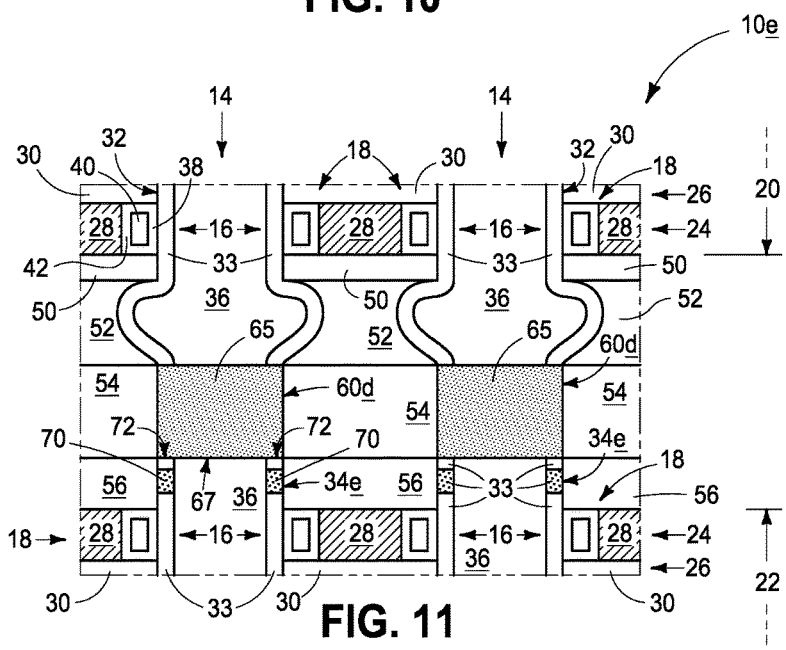
FIG. 11 is a diagrammatic sectional view of a portion of an elevationally-extending string of memory cells in accordance with an embodiment of the invention.

In one embodiment and as shown, lower stack channel pillar 34d has an elevationally outermost surface 72, with region 70 extending elevationally outward to such outermost surface. Alternately, such region may not extend elevationally outward to such surface, for example as shown with respect to an alternate embodiment construction 10e in FIG. 11. Like numerals from the above-described embodiments have been used where appropriate, with some construction differences being indicated with the suffix "e". Any other attribute(s) or aspect(s) as shown and/or described above may be used.

Figure 12:
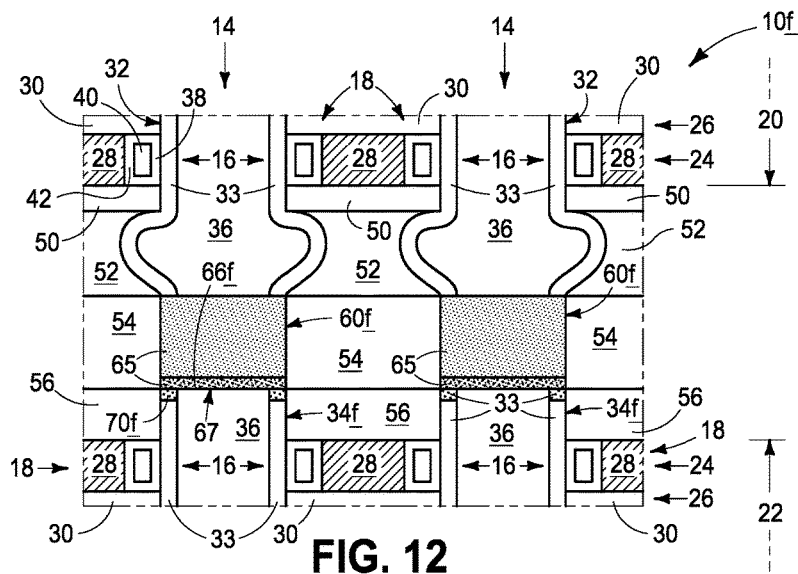
FIG. 12 is a diagrammatic sectional view of a portion of an elevationally-extending string of memory cells in accordance with an embodiment of the invention.

Each of the above embodiments is shown as having only one of (a) conductive material below the conductively-doped semiconductor material, or (b) a second non-p-type dopant within the conductively-doped semiconductor material that is different from the first dopant, with the second dopant being present at an atomic concentration within the semiconductor material of at least 0.1%, and being devoid of the other of (a) or (b). Alternately, these may be combined, for example as shown and described with reference to FIG. 12 in a construction 10f. Like numerals from the above-described embodiments have been used where appropriate, with some construction differences being indicated with the suffix "f". In construction 10f, lower stack channel pillar 34f has upper region 70f and conductive interconnect 60f comprises region 66f. Further, by way of example only, a metal material (not shown) might be substituted for region 66f or provided in addition thereto (not shown). Any other attribute(s) or aspect(s) as shown and/or described above may be used.

Embodiments of the invention include a method of forming an elevationally-extending string of memory cells individually comprising a programmable charge storage transistor. Such comprises forming an upper stack elevationally over a lower stack. The upper and lower stacks individually comprise vertically-alternating tiers comprising control gate material of individual charge storage field effect transistors vertically alternating with insulating material. The upper stack comprises an upper stack channel pillar extending through multiple of the vertically-alternating tiers in the upper stack. The lower stack comprises a lower stack channel pillar extending through multiple of the vertically-alternating tiers in the lower stack. A conductive interconnect comprising conductively-doped semiconductor material is elevationally between and electrically couples the upper and lower stack channel pillars together. The conductively-doped semiconductor material comprises conductivity-producing dopant therein. Some of the conductivity-producing dopant is thermally diffused elevationally out of the conductively-doped semiconductor material. An asymmetric diffusion barrier is used during the thermally diffusing to thermally diffuse more of said dopant upwardly into the upper stack channel pillar than diffusion of said dopant, if any, into the lower stack channel pillar. Tunnel insulator, charge storage material, and control gate blocking insulator are provided laterally between the respective upper and lower stack channel pillars and the control gate material. Any other attribute(s) or aspect(s) as shown and/or described above may be used.

CONCLUSION

In some embodiments, an elevationally-extending string of memory cells individually comprising a programmable charge storage transistor comprises an upper stack elevationally over a lower stack. The upper and lower stacks individually comprise vertically-alternating tiers comprising control gate material of individual charge storage field effect transistors vertically alternating with insulating material. An upper stack channel pillar extends through multiple of the vertically-alternating tiers in the upper stack and a lower stack channel pillar extends through multiple of the vertically-alternating tiers in the lower stack. Tunnel insulator, charge storage material, and control gate blocking insulator is laterally between the respective upper and lower stack channel pillars and the control gate material. A conductive interconnect comprises conductively-doped semiconductor material elevationally between and electrically coupling the upper and lower stack channel pillars together. The conductively-doped semiconductor material comprises conductivity-producing dopant therein. An asymmetric diffusion barrier is included and that allows greater diffusion of the conductivity-producing dopant from the conductively-doped semiconductor material into the upper stack channel pillar than diffusion of said dopant from the conductively-doped semiconductor material, if any, into the lower stack channel pillar. By way of examples only, regions/materials 66, 66*b*, 71, 70, 66*f*, and 70*f* in the above embodiments are example such asymmetric diffusion barriers. The diffusion barrier may be within the conductive interconnect (e.g., constructions 10, 10*a*, 10*b*, 10*c*, and 10*f*). The diffusion barrier may not be anywhere within the conductive interconnect (e.g., constructions 10*d* and 10*e*). The diffusion barrier may be within the conductive interconnect and within the lower stack channel pillar (e.g., construction 10*f*). The diffusion barrier may be within an upper region of the lower stack channel pillar (e.g., constructions 10*d*, 10*e*, and 10*f*).

In some embodiments, an elevationally-extending string of memory cells individually comprising a programmable charge storage transistor comprises an upper stack elevationally over a lower stack. The upper and lower stacks individually comprise vertically-alternating tiers comprising control gate material of individual charge storage field effect transistors vertically alternating with insulating material. An upper stack channel pillar extends through multiple of the vertically-alternating tiers in the upper stack and a lower stack channel pillar extends through multiple of the vertically-alternating tiers in the lower stack. Tunnel insulator, charge storage material, and control gate blocking insulator is laterally between the respective upper and lower stack channel pillars and the control gate material. A conductive interconnect comprising conductively-doped semiconductor material is elevationally between and electrically couples the upper and lower stack channel pillars together. The conductively-doped semiconductor material comprises a first conductivity-producing dopant. The conductive interconnect comprises a lower half thereof having a conductive region comprising at least one of (a) conductive material below the conductively-doped semiconductor material, or (b) a second non-p-type dopant within the conductively-doped semiconductor material that is different from the first dopant, the second dopant being present at an atomic concentration within the semiconductor material of at least 0.1%.

In some embodiments, an elevationally-extending string of memory cells individually comprises a programmable charge storage transistor comprises an upper stack elevationally over a lower stack. The upper and lower stacks individually comprise vertically-alternating tiers comprising control gate material of individual charge storage field effect transistors vertically alternating with insulating material. An upper stack p-type channel pillar extends through multiple of the vertically-alternating tiers in the upper stack and a lower stack p-type channel pillar extends through multiple of the vertically-alternating tiers in the lower stack. Tunnel insulator, charge storage material, and control gate blocking insulator is laterally between the respective upper and lower stack p-type channel pillars and the control gate material. A conductive interconnect comprising conductively-doped n-type semiconductor material is elevationally between and electrically couples the upper and lower stack p-type channel pillars together. The conductively-doped n-type semiconductor material comprises a first n-type conductivity-producing dopant. An upper region of the lower stack p-type channel pillar comprises a second non-p-type dopant that is different from the first n-type dopant. The second dopant is present in the upper region of the lower stack p-type channel pillar at an atomic concentration in the upper region of at least 0.1%.

In some embodiments, an elevationally-extending string of memory cells individually comprising a programmable charge storage transistor comprises an upper stack elevationally over a lower stack. The upper and lower stacks individually comprise vertically-alternating tiers comprising control gate material of individual charge storage field effect transistors vertically alternating with insulating material. An upper stack channel pillar extends through multiple of the vertically-alternating tiers in the upper stack and a lower stack channel pillar extends through multiple of the vertically-alternating tiers in the lower stack. Tunnel insulator, charge storage material, and control gate blocking insulator is laterally between the respective upper and lower stack channel pillars and the control gate material. The upper and lower channel pillars comprise a channel conductivity-modifying dopant in a quantity that produces intrinsic semiconductor properties enabling the upper and lower channel pillars to operably function as switchable "on" and "off" channels for the individual memory cells for control gate voltage above $V_t$ depending on programming state of the charge storage transistor for the respective individual memory cell. A conductive interconnect comprising conductively-doped semiconductor material is elevationally between and electrically couples the upper and lower stack channel pillars together. The conductively-doped semiconductor material comprises a first conductivity-producing dopant. An upper region of the lower stack channel pillar comprises a second non-p-type dopant that is different from the first dopant and is different from the channel conductivity-modifying dopant. The second dopant is present in the upper region of the lower stack channel pillar at an atomic concentration in the upper region of at least 0.1%.

In some embodiments, a method of forming an elevationally-extending string of memory cells individually comprising a programmable charge storage transistor comprises forming an upper stack elevationally over a lower stack. The upper and lower stacks individually comprise vertically-alternating tiers comprising control gate material of individual charge storage field effect transistors vertically alternating with insulating material. The upper stack comprises an upper stack channel pillar extending through multiple of the vertically-alternating tiers in the upper stack. The lower stack comprises a lower stack channel pillar extending through multiple of the vertically-alternating tiers in the lower stack. A conductive interconnect comprising conductively-doped semiconductor material is elevationally between and electrically couples the upper and lower stack channel pillars together. The conductively-doped semiconductor material comprises conductivity-producing dopant therein. Some of the conductivity-producing dopant is thermally diffused elevationally out of the conductively-doped semiconductor material. An asymmetric diffusion barrier is used during the thermally diffusing to thermally diffuse more of said dopant upwardly into the upper stack channel pillar than diffusion of said dopant, if any, into the lower stack channel pillar. Tunnel insulator, charge storage material, and control gate blocking insulator are provided laterally between the respective upper and lower stack channel pillars and the control gate material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An elevationally-extending string of memory cells individually comprising a programmable charge storage transistor, comprising:
   an upper stack elevationally over a lower stack, the upper and lower stacks individually comprising vertically-alternating tiers comprising control gate material of individual charge storage field effect transistors vertically alternating with insulating material;
   an upper stack channel pillar extending through multiple of the vertically-alternating tiers in the upper stack and a lower stack channel pillar extending through multiple of the vertically-alternating tiers in the lower stack; tunnel insulator, charge storage material, and control gate blocking insulator being laterally between the respective upper and lower stack channel pillars and the control gate material;
   a conductive interconnect comprising conductively-doped semiconductor material elevationally between and electrically coupling the upper and lower stack channel pillars together, the conductively-doped semiconductor material comprising conductivity-producing dopant therein; and
   an asymmetric diffusion barrier allowing greater diffusion of the conductivity-producing dopant from the conductively-doped semiconductor material into the upper stack channel pillar than diffusion, if any, of said dopant from the conductively-doped semiconductor material into the lower stack channel pillar.

2. The elevationally-extending string of memory cells of claim 1 wherein the diffusion barrier is within the conductive interconnect.

3. The elevationally-extending string of memory cells of claim 1 wherein the diffusion barrier is within the conductive interconnect and within the lower stack channel pillar.

4. An elevationally-extending string of memory cells individually comprising a programmable charge storage transistor, comprising:
   an upper stack elevationally over a lower stack, the upper and lower stacks individually comprising vertically-alternating tiers comprising control gate material of individual charge storage field effect transistors vertically alternating with insulating material;
   an upper stack channel pillar extending through multiple of the vertically-alternating tiers in the upper stack and a lower stack channel pillar extending through multiple of the vertically-alternating tiers in the lower stack; tunnel insulator, charge storage material, and control gate blocking insulator being laterally between the respective upper and lower stack channel pillars and the control gate material; and
   a conductive interconnect comprising conductively-doped semiconductor material elevationally between and electrically coupling the upper and lower stack channel pillars together, the conductively-doped semiconductor material comprising a first conductivity-producing dopant, the conductive interconnect comprising a lower half thereof having a conductive region comprising at least one of (a) conductive material below the conductively-doped semiconductor material, or (b) a second non-p-type dopant within the conductively-doped semiconductor material that is different from the first dopant, the second dopant being present at an atomic concentration within the semiconductor material of at least 0.1%.

5. The elevationally-extending string of memory cells of claim 4 comprising (a).

6. The elevationally-extending string of memory cells of claim 5 wherein the conductive material is directly against the conductively-doped semiconductor material.

7. The elevationally-extending string of memory cells of claim 5 wherein the conductive material is not another conductively-doped semiconductor material.

8. The elevationally-extending string of memory cells of claim 7 wherein the conductive material is metal material.

9. The elevationally-extending string of memory cells of claim 5 wherein the conductive material extends elevationally upward along sidewalls of the conductively-doped semiconductor material.

10. The elevationally-extending string of memory cells of claim 5 wherein the conductive material does not extend elevationally upward along sidewalls of the conductively-doped semiconductor material.

11. The elevationally-extending string of memory cells of claim 5 wherein the conductive material comprises at least one of Ti, TiN, W, WN, $WSi_x$, TiSi, $Ti_xSi_yN_z$, and $W_xSi_yN_z$.

12. The elevationally-extending string of memory cells of claim 5 wherein the conductive material comprises a non-stoichiometric metal-rich amorphous compound.

13. The elevationally-extending string of memory cells of claim 4 comprising (b).

14. The elevationally-extending string of memory cells of claim 13 wherein the second non-p-type dopant is not electrically active.

15. The elevationally-extending string of memory cells of claim 13 wherein the second non-p-type dopant is electrically active and n-type.

16. An elevationally-extending string of memory cells individually comprising a programmable charge storage transistor, comprising:
   an upper stack elevationally over a lower stack, the upper and lower stacks individually comprising vertically-alternating tiers comprising control gate material of individual charge storage field effect transistors vertically alternating with insulating material;
   an upper stack p-type channel pillar extending through multiple of the vertically-alternating tiers in the upper stack and a lower stack p-type channel pillar extending through multiple of the vertically-alternating tiers in the lower stack; tunnel insulator, charge storage material, and control gate blocking insulator being laterally between the respective upper and lower stack p-type channel pillars and the control gate material;
   a conductive interconnect comprising conductively-doped n-type semiconductor material elevationally between and electrically coupling the upper and lower stack p-type channel pillars together, the conductively-doped n-type semiconductor material comprising a first n-type conductivity-producing dopant; and
   an upper region of the lower stack p-type channel pillar comprising a second non-p-type dopant that is different from the first n-type dopant, the second dopant being present in the upper region of the lower stack p-type channel pillar at an atomic concentration in the upper region of at least 0.1%.

17. An elevationally-extending string of memory cells individually comprising a programmable charge storage transistor, comprising:
   an upper stack elevationally over a lower stack, the upper and lower stacks individually comprising vertically-alternating tiers comprising control gate material of individual charge storage field effect transistors vertically alternating with insulating material;
   an upper stack channel pillar extending through multiple of the vertically-alternating tiers in the upper stack and a lower stack channel pillar extending through multiple of the vertically-alternating tiers in the lower stack; tunnel insulator, charge storage material, and control gate blocking insulator being laterally between the respective upper and lower stack channel pillars and the control gate material; the upper and lower channel pillars comprising a channel conductivity-modifying dopant in a quantity that produces intrinsic semiconductor properties enabling the upper and lower channel pillars to operably function as switchable "on" and "off" channels for the individual memory cells for control gate voltage above and below, respectively, a $V_t$ depending on programming state of the charge storage transistor for the respective individual memory cell;
   a conductive interconnect comprising conductively-doped semiconductor material elevationally between and electrically coupling the upper and lower stack channel pillars together, the conductively-doped semiconductor material comprising a first conductivity-producing dopant; and
   an upper region of the lower stack channel pillar comprising a second non-p-type dopant that is different from the first dopant and is different from the channel conductivity-modifying dopant, the second dopant being present in the upper region of the lower stack channel pillar at an atomic concentration in the upper region of at least 0.1%.

18. The elevationally-extending string of memory cells of claim 1 wherein the diffusion barrier is not anywhere within the conductive interconnect.

19. The elevationally-extending string of memory cells of claim 1 wherein the diffusion barrier is within an upper region of the lower stack channel pillar.

20. The elevationally-extending string of memory cells of claim 5 being devoid of (b).

21. The elevationally-extending string of memory cells of claim 13 wherein the second non-p-type dopant is at least one of C, N, and As.

22. The elevationally-extending string of memory cells of claim 13 wherein atomic concentration of all of the second non-p-type dopant present within the conductively-doped semiconductor material is no greater than 40%.

23. The elevationally-extending string of memory cells of claim 13 wherein atomic concentration of all of the second non-p-type dopant present within the conductively-doped semiconductor material is no greater than 8%.

24. The elevationally-extending string of memory cells of claim 13 wherein atomic concentration of all of the second non-p-type dopant present within the conductively-doped semiconductor material is no greater than 2%.

25. The elevationally-extending string of memory cells of claim 13 wherein the conductive interconnect has an elevationally innermost surface, the region extending elevationally inward to said innermost surface.

26. The elevationally-extending string of memory cells of claim 25 wherein the second non-p-type dopant is within an elevationally outermost region of the lower stack channel pillar.

27. The elevationally-extending string of memory cells of claim 13 wherein the conductive interconnect has an elevationally innermost surface, the region not extending elevationally inward to said innermost surface.

28. The elevationally-extending string of memory cells of claim 13 being devoid of (a).

29. The elevationally-extending string of memory cells of claim 16 wherein the second non-p-type dopant is not electrically active.

30. The elevationally-extending string of memory cells of claim 16 wherein the lower stack channel pillar has an elevationally outermost surface, the region extending elevationally outward to said outermost surface.

31. The elevationally-extending string of memory cells of claim 16 wherein the lower stack channel pillar has an elevationally outermost surface, the region not extending elevationally outward to said outermost surface.

* * * * *